US 12,075,646 B2

(12) United States Patent
Kim

(10) Patent No.: US 12,075,646 B2
(45) Date of Patent: Aug. 27, 2024

(54) COVER PANEL INCLUDING VIA HOLE CONNTECTED TO WIRE, AND DISPLAY DEVICE COMPRISING SAME

(71) Applicant: Samsung Display Co., Ltd., Yongin-si (KR)

(72) Inventor: Hyeong Gwaon Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 490 days.

(21) Appl. No.: 17/298,897

(22) PCT Filed: Dec. 18, 2019

(86) PCT No.: PCT/KR2019/017948
§ 371 (c)(1),
(2) Date: Jun. 1, 2021

(87) PCT Pub. No.: WO2020/138820
PCT Pub. Date: Jul. 2, 2020

(65) Prior Publication Data
US 2022/0020956 A1    Jan. 20, 2022

(30) Foreign Application Priority Data
Dec. 28, 2018 (KR) .................. 10-2018-0172501

(51) Int. Cl.
*H10K 50/844* (2023.01)
*H10K 50/86* (2023.01)
*H10K 50/87* (2023.01)
*H10K 59/131* (2023.01)

(52) U.S. Cl.
CPC ......... *H10K 50/844* (2023.02); *H10K 50/865* (2023.02); *H10K 50/87* (2023.02); *H10K 59/131* (2023.02)

(58) Field of Classification Search
CPC .. H10K 50/844; H10K 50/865; H10K 59/131; H10K 59/873; H10K 59/8792
USPC .......................................................... 257/40
See application file for complete search history.

(56) References Cited

U.S. PATENT DOCUMENTS

| 7,511,295 B2 | 3/2009 | Kim et al. |
| 7,887,385 B2 | 2/2011 | Ohmi et al. |
| 8,698,189 B2 | 4/2014 | Park et al. |
| 9,961,789 B2 | 5/2018 | Kim et al. |

(Continued)

FOREIGN PATENT DOCUMENTS

| CN | 101894920 A | 11/2010 |
| CN | 102856295 A | 1/2013 |

(Continued)

OTHER PUBLICATIONS

International Search Report dated Apr. 21, 2020, for corresponding Application No. PCT/KR2019/017948, 4 pages.

(Continued)

*Primary Examiner* — Matthew E. Gordon
(74) *Attorney, Agent, or Firm* — Lewis Roca Rothgerber Christie LLP

(57) ABSTRACT

A cover panel includes: a light blocking layer; a cushion layer overlapping with the light blocking layer; a wire overlapping with the cushion layer; and a via hole connected to the wire, and penetrating the light blocking layer and the cushion layer.

11 Claims, 22 Drawing Sheets

(56) References Cited

U.S. PATENT DOCUMENTS

| | | | |
|---|---|---|---|
| 10,236,471 | B2 | 3/2019 | Oh et al. |
| 10,741,789 | B2 | 8/2020 | Oh et al. |
| 10,842,033 | B2 | 11/2020 | Kim et al. |
| 11,444,265 | B2 | 9/2022 | Oh et al. |
| 2011/0062460 | A1 | 3/2011 | Ohmi et al. |
| 2015/0171151 | A1 | 6/2015 | Chae |
| 2017/0148702 | A1 | 5/2017 | Funayama et al. |
| 2017/0168621 | A1* | 6/2017 | Jo ............... H05K 7/1427 |
| 2017/0338295 | A1 | 11/2017 | Lee et al. |
| 2018/0019293 | A1* | 1/2018 | Choi ............. H10K 59/126 |
| 2018/0110122 | A1* | 4/2018 | Lee ............... H05K 1/147 |
| 2018/0204526 | A1 | 7/2018 | Heo et al. |
| 2019/0155417 | A1* | 5/2019 | Lee ............... H10K 50/844 |

FOREIGN PATENT DOCUMENTS

| | | |
|---|---|---|
| CN | 107180850 A | 9/2017 |
| CN | 107623080 A | 1/2018 |
| CN | 107946339 A | 4/2018 |
| KR | 10-2007-0003295 A | 1/2007 |
| KR | 10-1176026 B1 | 8/2012 |
| KR | 10-2015-0011868 A | 2/2015 |
| KR | 10-2017-0059066 A | 5/2017 |
| KR | 10-2017-0130016 A | 11/2017 |
| KR | 10-2018-0008965 A | 1/2018 |
| KR | 10-2018-0041301 A | 4/2018 |

OTHER PUBLICATIONS

Chinese Office Action dated May 21, 2024, issued in corresponding Chinese Patent Application No. 201980086358.1 (16 pages).

\* cited by examiner

COVER PANEL INCLUDING VIA HOLE CONNTECTED TO WIRE, AND DISPLAY DEVICE COMPRISING SAME

CROSS-REFERENCE TO RELATED APPLICATIONS

This application is a U.S. National Phase Patent Application of International Patent Application Number PCT/KR2019/017948, filed on Dec. 18, 2019, which claims priority to Korean Patent Application Number 10-2018-0172501, filed on Dec. 28, 2018, the entire content of all of which is incorporated herein by reference.

BACKGROUND

1. Field

Aspects of one or more embodiments of the present disclosure relate to a cover panel, and a display device including the same.

2. Description of the Related Art

Recently, a light emitting diode display has attracted attention as a device for displaying an image.

Because the light emitting diode display has a self-emission characteristic, and does not use an additional light source, unlike a liquid crystal display device, it may be possible to reduce a thickness and weight of the light emitting diode display. Further, the light emitting diode display has high-quality characteristics, for example, such as low power consumption, high luminance, and high response speed.

Generally, the light emitting diode display includes a substrate, a plurality of transistors disposed on the substrate, a plurality of insulating layers disposed between wires included in the transistors, and a light emitting diode connected to the transistors.

SUMMARY

One or more embodiments of the present disclosure are directed to a full screen display device having a reduced dead space. One or more embodiments of the present disclosure are directed to a display device with improved display quality by including pixels having uniform or substantially uniform luminance by preventing or reducing a voltage drop.

According to one or more embodiments, a cover panel includes: a light blocking layer; a cushion layer overlapping with the light blocking layer; a wire overlapping with the cushion layer; and a via hole connected to the wire, and penetrating the light blocking layer and the cushion layer.

In an embodiment, the cover panel may include a first surface and a second surface; and the wire may be on the first surface, and may include a pad overlapping with the via hole.

In an embodiment, the wire may include a plurality of pads; and the plurality of pads may be located along a first direction.

In an embodiment, the cover panel may include a pad area at which the via hole and the pad overlap with each other; and the cover panel may include a plurality of pad areas.

In an embodiment, the plurality of pad areas may be spaced from each other along a second direction.

In an embodiment, the cover panel may include at least two via holes that are connected to the wire.

In an embodiment, the wire may include: a horizontal portion extending along a first direction; and a vertical portion connected to the horizontal portion, and extending along a second direction.

In an embodiment, the cover panel may further include a heat dissipation layer between the cushion layer and the wire.

In an embodiment, the cover panel may further include a heat dissipation layer overlapping with the cushion layer; and the heat dissipation layer and the wire may be located at the same layer as each other.

In an embodiment, the wire may be configured to receive a power voltage.

According to one or more embodiments of the present disclosure, a display device includes: a substrate; a display part on the substrate, and overlapping with the substrate; and a cover panel on a rear surface of the substrate. The cover panel includes: a functional layer on the rear surface of the substrate; a via hole penetrating the functional layer; and a wire on the functional layer, and connected to the display part through the via hole.

In an embodiment, the via hole may penetrate the substrate.

In an embodiment, the cover panel may include: a first surface; and a second surface overlapping with the first surface, and facing the substrate; and the wire may include a pad on the first surface, and overlapping with the via hole.

In an embodiment, the cover panel may include a pad area at which the via hole and the pad overlap with each other; and the cover panel may include a plurality of pad areas.

In an embodiment, the cover panel may include: a light blocking layer; and a cushion layer overlapping with the light blocking layer.

In an embodiment, the cover panel may further include a heat dissipation layer overlapping with the cushion layer; and the wire may be located on a rear surface of the heat dissipation layer.

In an embodiment, the cover panel may further include a heat dissipation layer overlapping with the cushion layer; and the wire and the heat dissipation layer may be located at the same layer as each other.

In an embodiment, the substrate may include: a display area configured to display an image; and a peripheral area around the display area.

In an embodiment, at least one of the plurality of pad areas may overlap with the display area.

In an embodiment, the plurality of pad areas may overlap with the peripheral area.

In an embodiment, the display device may further include an additional power wire on the substrate, and overlapping with the peripheral area; and the additional power wire and the wire may be located at different surfaces from each other based on the substrate.

In an embodiment, the wire may include: a first wire configured to supply a first power voltage; and a second wire configured to supply a second power voltage.

According to one or more embodiments, a full screen display device may be provided by reducing a dead space. In addition, because a voltage drop phenomenon may be prevented or reduced, and uniformity of a plurality of pixels disposed at (e.g., in or on) a display area may be improved, a display device with improved display quality may be provided.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
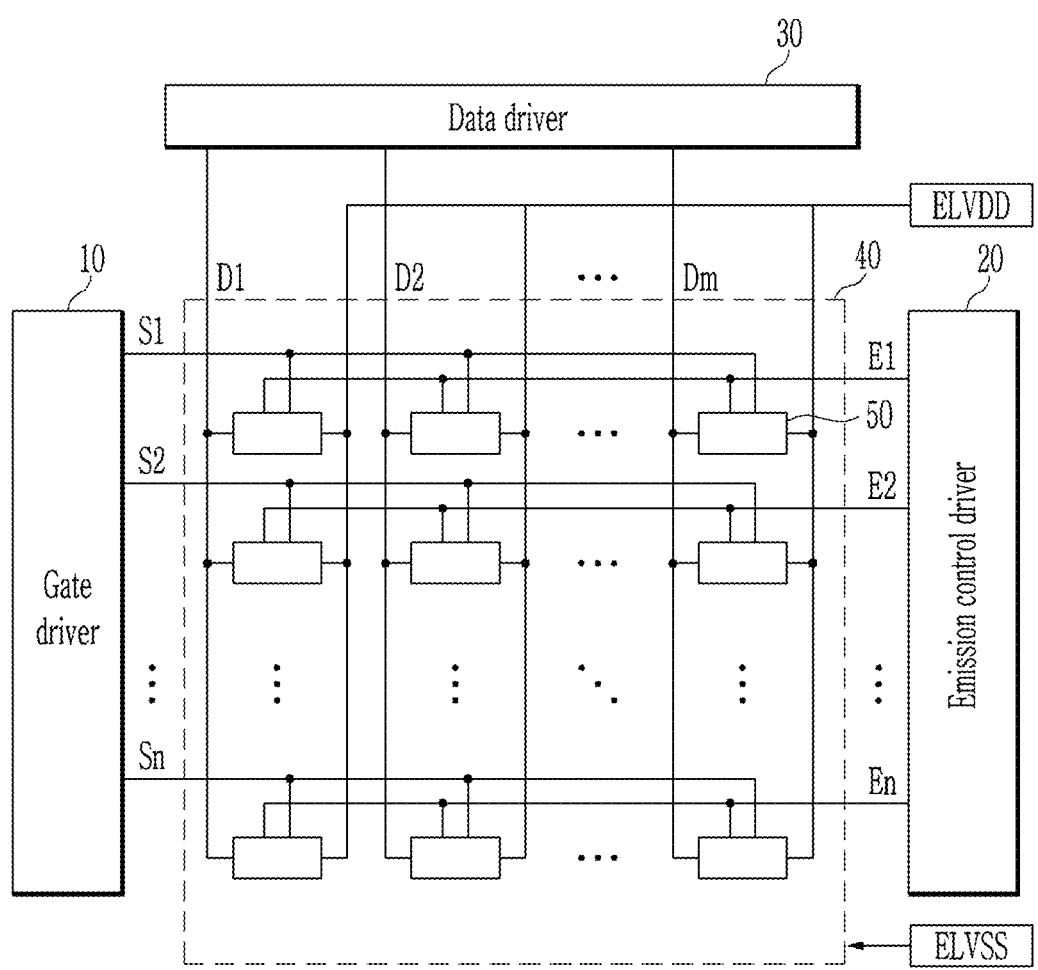
FIG. 1 illustrates a block diagram of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes and thicknesses of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Further, as used in the specification, the terms "on" or "above" may refer to being positioned on or below an object portion, and does not necessarily refer to being positioned on the upper side of the object portion based on a gravitational direction.

In the figures, the first direction DR1, the second direction DR2, and the third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

Further, throughout the specification, the phrase "in a plan view" or "on a plane" may refer to a view of a target portion from the top, and the phrase "in a cross-sectional view" or "on a cross-section" may refer to a view of a cross-section formed by vertically cutting a target portion from the side.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to an embodiment will be described with reference to FIG. 1. FIG. 1 illustrates a block diagram of a display device according to an embodiment.

Referring to FIG. 1, the display device may include a gate driver 10, an emission control driver 20, a data driver 30, and a display part (e.g., a display panel or a display layer) 40. The display part 40 includes a plurality of pixels 50.

The gate driver 10 generates a gate signal in response to a driving power source and control signals supplied from the outside, and sequentially supplies the gate signal to gate lines S1 to Sn, where n is a natural number. Thus, the pixels 50 are selected by the gate signal to be sequentially supplied with a data signal.

The emission control driver 20 sequentially supplies an emission control signal to emission control lines E1 to En, which are disposed parallel to or substantially parallel to the gate lines S1 to Sn, in response to the driving power source and the control signals supplied from the outside. Emission of the pixels 50 are controlled by the emission control signal.

The gate driver 10 and the emission control driver 20 may be provided in a form of a thin film transistor on a substrate together with a pixel circuit included at (e.g., in or on) the display part 40, or may be mounted on the substrate in a form of a chip. Positions of the gate driver 10 and the emission control driver 20 are not limited to those illustrated in FIG. 1, and the emission control driver 20 may be omitted according to a structure of the pixels 50.

The data driver 30 generates a data signal in response to data (e.g., image data) and the control signals supplied from the outside, and supplies the data signal to data lines D1 to Dm. The data signal supplied to the data lines D1 to Dm is supplied to the pixels 50 selected by the gate signal whenever the gate signal is supplied. The pixels 50 charge a voltage corresponding to the data signal.

The display part 40 includes the plurality of pixels 50 disposed at crossing portions of the gate lines S1 to Sn and the data lines D1 to Dm. The display part 40 is supplied with a first power voltage ELVDD, which is a high-potential pixel power source, and a second power voltage ELVSS, which is a low-potential pixel power source. The first power voltage ELVDD and the second power voltage ELVSS are transmitted to the pixels 50. The pixels 50 may display an image by emitting light having a luminance corresponding to a driving current flowing from the first power voltage ELVDD to the second power voltage ELVSS in response to the data signal.

The display device according to the present embodiment may supply the first power voltage ELVDD and the second power voltage ELVSS from a rear surface of a substrate, or more specifically, from a rear surface of a cover panel, which will be described in more detail below.

Figure 2A:
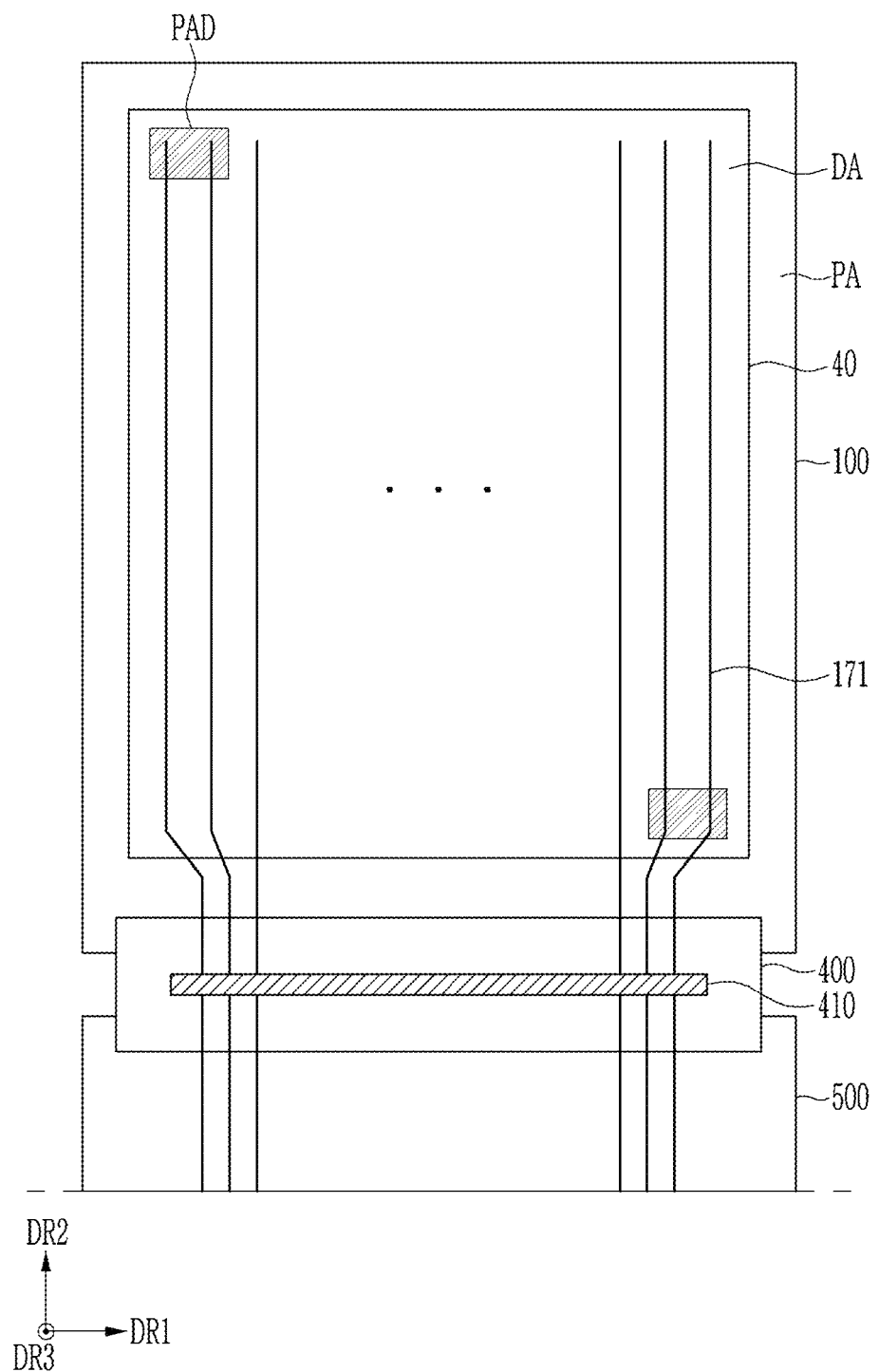
FIGS. 2A-2B illustrate a schematic top plan view of a display device according to one or more embodiments.
Figure 2B:
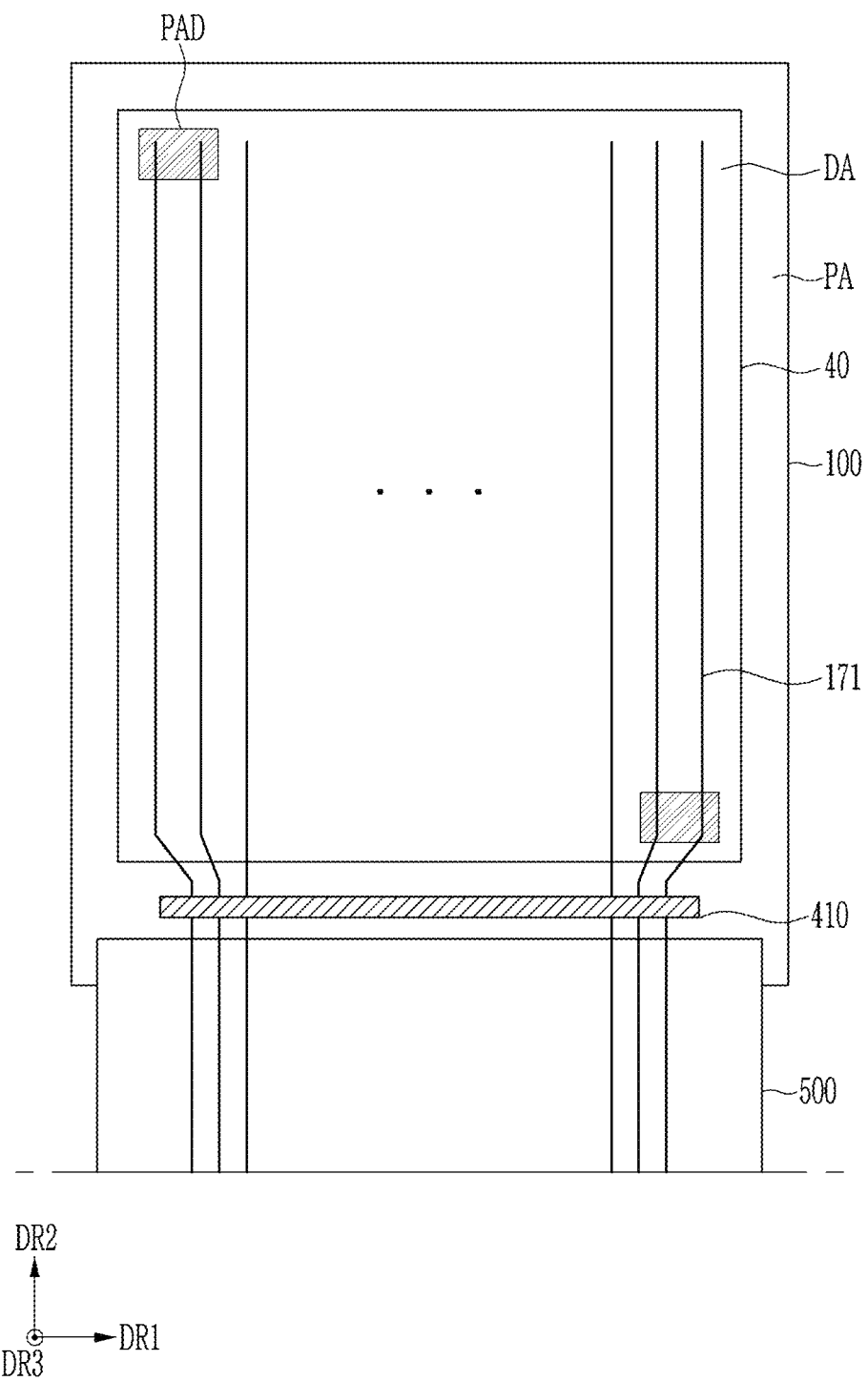

Hereinafter, a display device according to one or more embodiments will be described in more detail with reference to FIG. 1, FIG. 2A, and FIG. 2B. FIG. 2A and FIG. 2B illustrate a schematic top plan view of a display device according to one or more embodiments. Redundant description of the same or substantially the same constituent elements may not be repeated.

Referring to FIG. 2A, the display device according to the present embodiment includes a substrate 100, the display part 40 disposed on the substrate 100, and a driver 500 connected to an end (e.g., an edge) of the substrate 100.

The substrate 100 may include a display area DA for displaying a screen, and a peripheral area PA disposed around (e.g., to surround around a periphery of) the display area DA. The display area DA may overlap with the display part 40 described in more detail above with reference to FIG. 1, and the plurality of pixels 50 may be disposed at (e.g., in or on) the display area DA. A stacked structure of the pixels 50 included at (e.g., in or on) the display part 40 will be described in more detail below with reference to FIG. 6.

According to one or more embodiments, one end (e.g., one edge) of the substrate 100 may be connected to the driver 500. The driver 500 may be connected to the display area DA disposed on the substrate 100 through a driving integrated circuit 410 and a signal line, to supply a data signal and a gate signal (hereinafter, simply referred to as a 'signal') to a gate line and a data line 171.

According to the present embodiment, a flexible circuit board 400 may be connected to the end (e.g., the edge) of the substrate 100, and the driving integrated circuit 410 may be mounted on the flexible circuit board 400. The flexible circuit board 400 may be a package in a form of a chip on film (COF), and may be particularly applied to a flat panel display device (for example, such as a rigid OLED display device).

However, the flexible circuit board 400, the driving integrated circuit 410, and the driver 500 are not limited to the above, and as shown in FIG. 2B, the flexible circuit board 400 may be omitted. In this case, the driving integrated circuit 410 may be in a form of a chip on plastic (COP) disposed at (e.g., in or on) the peripheral area PA of the substrate 100. The driver 500 may be directly connected to one end of the substrate 100, and a signal received through the driver 500 and the driving integrated circuit 410 may supply a power voltage and a signal to the display part 40. According to an embodiment, a power wire for providing the first power voltage ELVDD or the second power voltage ELVSS described above with reference to FIG. 1 may not be disposed on a surface (e.g., on one surface) of the substrate 100. Accordingly, it may be possible to reduce an area occupied by a power wire in the peripheral area PA, so that a dead space of the display device may be reduced. As the dead space is decreased, it may be easier to provide a full screen display device.

According to an embodiment, a plurality of pad areas PAD may be disposed on a rear surface of the substrate 100. In FIG. 2A and FIG. 2B, an area corresponding to the pad area PAD is shown as shaded boxes on the substrate 100 for convenience of illustration.

The plurality of pad areas PAD disposed on the rear surface of the substrate 100 may overlap with the display area DA in some embodiments. In a case in which the display device according to an embodiment is a front light emitting display device that emits light towards the front, the plurality of pad areas PAD may not be viewed by a user even when the pad areas are disposed at (e.g., in or on) the display area DA.

The display part 40 may be connected to the plurality of pad areas PAD, and may receive the first power voltage ELVDD and/or the second power voltage ELVSS described above through the pad area PAD. As the plurality of pad areas PAD for providing the power voltage may overlap with the display area DA, an area of the peripheral area PA may be reduced, and the full screen display device may be easily provided by reducing the dead space.

According to an embodiment, the display part 40 may be connected to the plurality of pad areas PAD. The display part 40 may receive the same power voltage from upper and lower sides thereof in a plan view. No IR drop phenomenon may occur or substantially occur in the display part 40, and a uniform or substantially uniform voltage may be provided to an entirety of the display area DA, such that uniform display quality may be improved. In addition, when the power voltage is provided through the peripheral area PA, wires may be concentrated at (e.g., in or on) a partial area thereof, so that heat may occur due to a bottleneck phenomenon in which a current is concentrated in the partial area. However, according to an embodiment, it may be possible to effectively suppress heat from occurring because the wires may not be densely disposed.

Figure 3A:
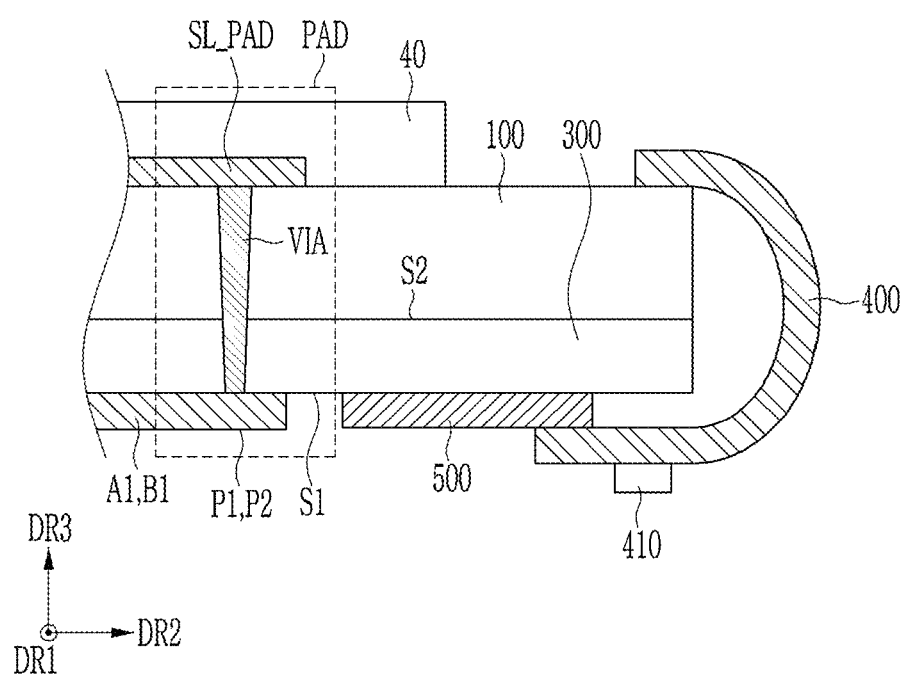
FIGS. 3A-3B illustrate a schematic cross-sectional view of an area of a display device according to one or more embodiments.
Figure 3B:
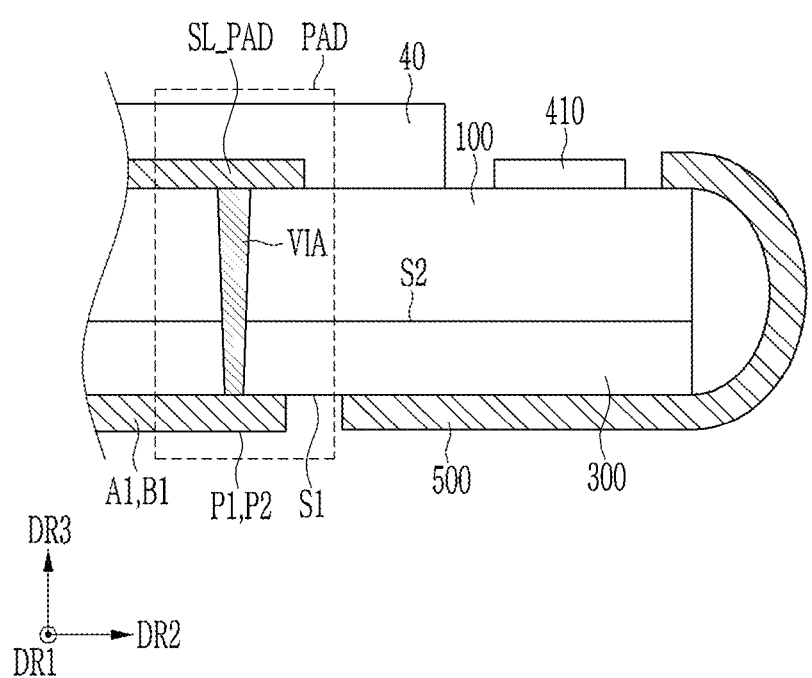
Figure 4:
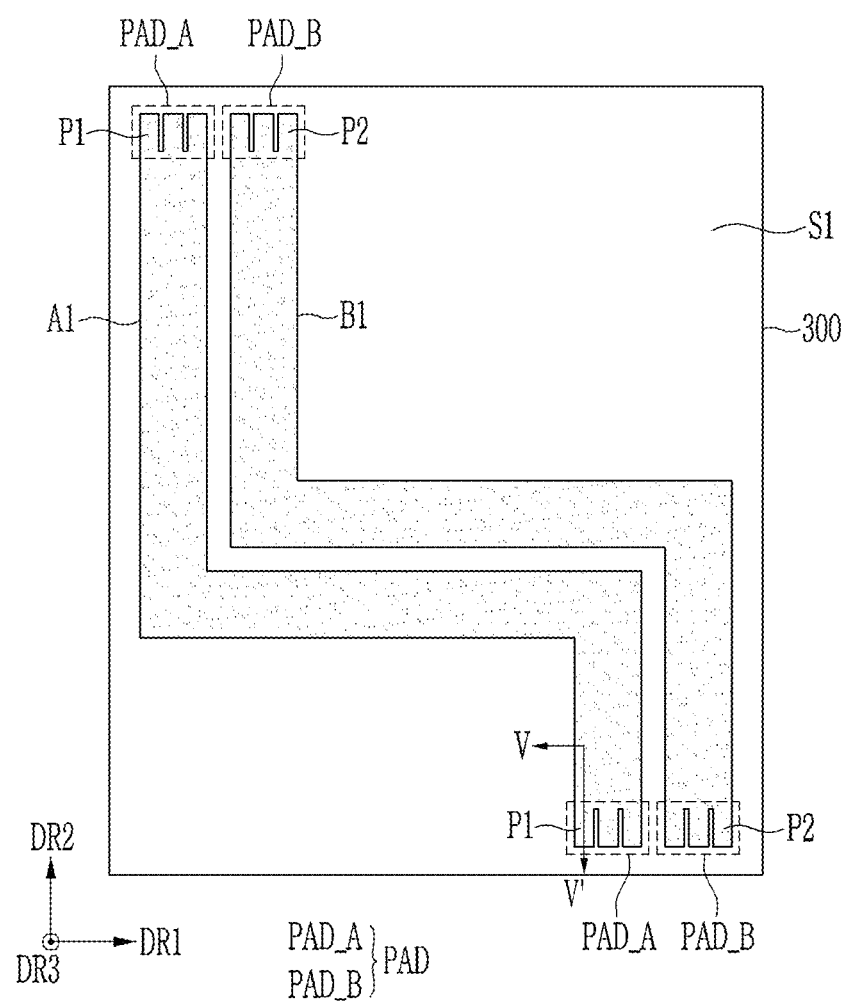
FIG. 4 illustrates a schematic top plan view of a rear surface of a cover panel according to an embodiment.
Figure 5A:
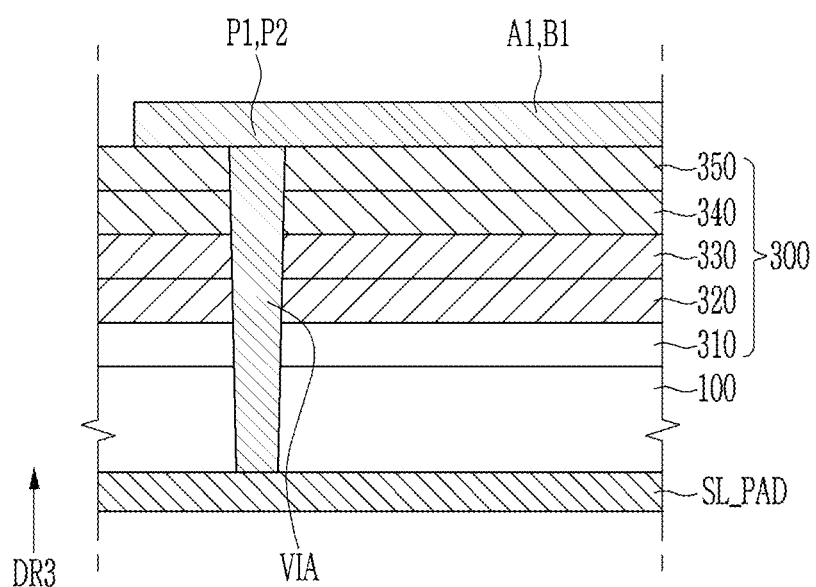
FIG. 5A illustrates a cross-sectional view taken along the line V-V of FIG. 4.
Figure 5B:
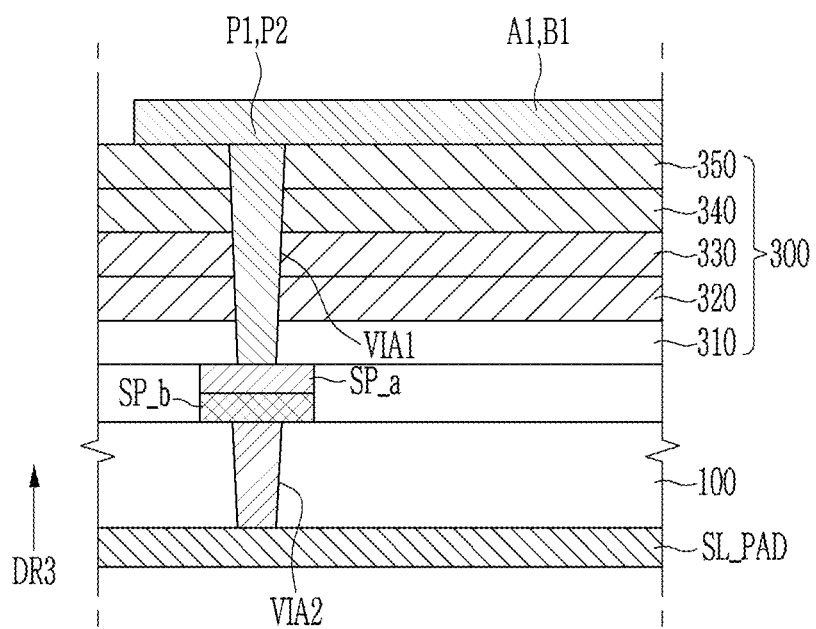
FIG. 5B illustrates a cross-sectional view of a modified embodiment of FIG. 5A.

Hereinafter, a configuration of applying the power voltage to the display part 40 from the rear surface of the substrate 100 will be described in more detail with reference to FIG. 3A to FIG. 5B. FIG. 3A and FIG. 3B illustrate a schematic cross-sectional view of an area of a display device according to one or more embodiments, and FIG. 4 illustrates a schematic top plan view of a rear surface of a cover panel according to an embodiment. FIG. 5A illustrates a cross-sectional view taken along the line V-V of FIG. 4, and FIG. 5B illustrates a modified embodiment of FIG. 5A. Redundant description of the same or substantially the same constituent elements as those described above with reference to FIG. 1, FIG. 2A, and FIG. 2B may not be repeated.

First, referring to FIG. 3A and FIG. 4, the display part 40 is disposed on one surface of the substrate 100. In this case, the display part 40 may include a signal pad portion SL_PAD for receiving a power voltage. The signal pad portion SL_PAD may receive, for example, the first power voltage ELVDD, the second power voltage ELVSS, or both the first power voltage ELVDD and the second power voltage ELVSS for each pixel. The signal pad portion SL_PAD may be disposed at (e.g., in or on) the display area in some embodiments. In addition, the signal pad portion SL_PAD may be formed with at least one layer on the substrate 100, and may be disposed at any suitable position overlapping with the pad area PAD, which will be described in more detail below.

As shown in FIG. 3A, the flexible circuit board 400 connected to the edge of the substrate 100 may be bent based on a bending axis (e.g., a predetermined bending axis), for example, such as a bending axis that is parallel to or substantially parallel to a first direction DR1.

However, the present disclosure is not limited thereto, and as shown in FIG. 3B, the driver 500 connected to the edge of the substrate 100 may be bent based on a bending axis (e.g., a predetermined bending axis), for example, such as a bending axis that is parallel to or substantially parallel to the first direction DR1. A portion of the driver 500 may be disposed on the rear surface of the substrate 100 by being bent. In this case, one end of the driver 500 may be electrically connected to the peripheral area of the substrate 100.

The cover panel 300 may be disposed on the rear surface of the substrate 100 facing one surface of the substrate 100. In the figures, a configuration in which the cover panel 300 directly contacts the rear surface of the substrate 100 is illustrated, but the present disclosure is not limited thereto, and a separate protective film may be interposed between the substrate 100 and the cover panel 300.

The cover panel 300 may include a first surface S1, and a second surface S2 opposite the first surface S1. The second surface S2 may be a surface facing the substrate 100. The second surface S2 may face the rear surface of the substrate 100.

The substrate 100 and the cover panel 300 according to an embodiment may include a via hole VIA penetrating the substrate 100 and the cover panel 300. The via hole VIA may be formed through any suitable technique known by those skilled in the art, and any suitable method for forming the via hole VIA may be used.

The cover panel 300 may include wires A1 and B1 disposed on the first surface S1. The wires A1 and B1 may include pads P1 and P2 overlapping with the via holes VIA. In FIG. 4, an embodiment in which the pads P1 and P2 are integrated with the wires A1 and B1, and the pads P1 and P2 are formed at end portions of wires A1 and B1 is illustrated, but the present disclosure is not limited thereto, and the wires A1 and B1 and the pads P1 and P2 may be formed on separate layers from one another.

The end portions of the wires A1 and B1 according to the embodiment shown in FIG. 4 may include the pads P1 and P2. The pads P1 and P2 may be connected to the display part 40 through the via hole VIA passing through the cover panel 300 and the substrate 100. In more detail, the wires A1 and B1 may be connected to the signal pad portion SL_PAD included at (e.g., in or on) the display part 40 through the pads P1 and P2 and the via hole VIA. The signal pad portion SL_PAD may receive a voltage (for example, the first power voltage ELVDD or the second power voltage ELVSS) from the wires A1 and B1 disposed on the rear surface of the cover panel 300 through the via hole VIA provided in (e.g., penetrating) the substrate 100 and the cover panel 300.

The cover panel 300 may include the pad area PAD at (e.g., in or on) which the pads P1 and P2 included in the wires A1 and B1 and the via hole VIA overlap with one another. The pad area PAD according to an embodiment may also overlap with the signal wire portion SL_PAD. The pad area PAD may be electrically connected to the signal wire portion SL_PAD through the via hole VIA. The wires A1 and B1 may be connected to the driver 500 to receive the first power voltage ELVDD and/or the second power voltage ELVSS.

Hereinafter, the rear surface of the cover panel 300 will be described in more detail with reference to FIG. 4, FIG. 5A, and FIG. 5B.

As shown in FIG. 4, the wires A1 and B1 may be disposed on the first surface S1 of the cover panel 300. The wires A1 and B1 according to an embodiment may include a horizontal portion extending along the first direction DR1, and a vertical portion extending along a second direction DR2. In FIG. 4, an embodiment in which the wires A1 and B1 are bent twice to include one horizontal portion and two vertical portions is illustrated, but the shapes of the wires A1 and B1 are not limited thereto, and the wires A1 and B1 may have various suitable shapes.

A plurality of wires A1 and B1 may be disposed on the first surface S1 of the cover panel 300. The plurality of wires A1 and B1 may include a first wire A1 and a second wire B1. The first wire A1 according to an embodiment may supply the first power voltage ELVDD to the display part 40, and the second wire B1 may supply the second power voltage ELVSS to the display part 40.

The first wire A1 may include the first pad P1, and in some embodiments, may include a plurality of first pads P1. The plurality of first pads P1 may be arranged along the first direction DR1. The plurality of first pads P1 may be spaced apart from each other in a plan view along the first direction DR1. In the embodiment shown in FIG. 4, the plurality of first pads P1 are illustrated as being spaced apart from each other along the first direction DR1, but the present disclosure is not limited thereto, and the plurality of first pads P1 may have various suitable numbers, shapes, and arrangements.

The pad area PAD according to an embodiment may include a first pad area PAD_A and a second pad area PAD_B.

The cover panel 300 may include a plurality of first pad areas PAD_A. The plurality of first pad areas PAD_A may be formed to be spaced apart from each other in a plan view. For example, one first pad area PAD_A may be disposed at an upper end of the cover panel 300 in a plan view, and another first pad area PAD_A may be disposed at a lower end of the cover panel 300 in the plan view. The plurality of first pad areas PAD_A may be disposed to be spaced apart from each other along the second direction DR2 in a plan view.

The cover panel 300 according to the present embodiment may include the plurality of first pad areas PAD_A, and a corresponding via hole VIA and a corresponding first pad P1 may overlap with each other at (e.g., in or on) each first pad area PAD_A. The cover panel 300 and the substrate 100 according to the present embodiment may include a plurality of via holes VIA, for example, at least two via holes VIA.

The first wire A1 may overlap with at least two first pad areas PAD_A. The first wire A1 may be connected to the signal wire portion SL_PAD through at least two via holes VIA. The power voltage transmitted by the first wire A1 may be provided to the display part 40 through at least two areas. For example, the first power voltage transmitted by the first wire A1 may be provided through the via holes VIA disposed at upper and lower portions of the substrate 100. Accordingly, the first power voltage transmitted by the first wire A1 may be uniformly or substantially uniformly provided to the pixels disposed at the upper and lower portions of the substrate 100.

The second wire B1 may include the second pad P2, and in some embodiments, may include a plurality of second pads P2. The plurality of second pads P2 may be arranged along the first direction DR1. The plurality of second pads P2 may be spaced apart from each other in a plan view along the first direction DR1. In the embodiment of FIG. 4, the plurality of second pads P2 are illustrated as being spaced apart from each other along the first direction DR1, but the present disclosure is not limited thereto, and the plurality of second pads P2 may have various suitable numbers, shapes, and arrangements.

The cover panel 300 according to an embodiment may include a plurality of second pad areas PAD_B. The plurality of second pad areas PAD_B may be spaced apart from each other in a plan view. For example, one second pad area PAD_B may be disposed at the upper end of the cover panel 300 in a plan view, and another second pad area PAD_B may be disposed at the lower end of the cover panel 300 in the plan view. The plurality of second pad areas PAD_B may be disposed to be spaced apart from each other along the second direction DR2 in a plan view.

The cover panel 300 according to the present embodiment may include the plurality of second pad areas PAD_B, and a corresponding via hole VIA and a corresponding second pad P2 may overlap with each other at (e.g., in or on) each second pad area PAD_B. The cover panel 300 and the substrate 100 may include at least two via holes VIA.

The second wire B1 may overlap with at least two second pad areas PAD_B. The second wire B1 may be connected to the signal wire portion SL_PAD through at least two via holes VIA. The power voltage transmitted by the second wire B1 may be provided to the display part 40 through at least two areas. For example, the second power voltage transmitted by the second wire B1 may be provided through the via hole VIA disposed at upper and lower portions of the substrate 100. Accordingly, the second power voltage transmitted by the second wire B1 may be uniformly or substantially uniformly provided to the pixels disposed at the upper and lower portions of the substrate 100.

Hereinafter, a stacked structure of the cover panel 300 according to an embodiment will be described in more detail with reference to FIG. 5A.

The cover panel 300 according to the embodiment of FIG. 5A may include a plurality of functional layers having suitable or desired physical properties (e.g., predetermined physical properties). The functional layers may be referred to as a light blocking layer 310, cushion layers 320 and 330, and heat dissipation layers 340 and 350.

In some embodiments, an adhesive layer for bonding the respective layers to one another may be further included. The adhesive layer may be a transparent adhesive layer. For example, the adhesive layer may include an optically clear adhesive (OCA), an optically clear resin (OCR), or a pressure sensitive adhesive (PSA).

The light blocking layer 310 may be disposed on the rear surface of the substrate 100. For example, the light blocking layer 310 may be disposed on the rear surface of the substrate 100, and may block light incident on the display part 40. The light blocking layer 310 may include a black tape or a light blocking material.

The cover panel 300 may include the cushion layers 320 and 330 overlapping with the light blocking layer 310. The cushion layers 320 and 330 may absorb a physical impact applied to the display part 40. In some embodiments, the cushion layers 320 and 330 may have a concavo-convex structure, an embossed structure, and/or the like for impact absorption.

In FIG. 5A, an embodiment in which the cushion layers 320 and 330 include a plurality of layers is illustrated, but the present disclosure is not limited thereto, and the cushion layers 320 and 330 may include a single layer.

The cushion layers 320 and 330 may include any suitable material capable of absorbing impact. For example, the cushion layers 320 and 330 may include a polymer resin, for example, such as polyurethane, polycarbonate, polypropylene, polyimide, and/or polyethylene, a liquid rubber, a urethane-based material, or a sponge obtained by foam-molding an acrylic-based material.

The cover panel 300 may include the heat dissipation layers 340 and 350 overlapping with the cushion layers 320 and 330. The heat dissipation layers 340 and 350 may dissipate heat generated from the display part 40. In FIG. 5A, an embodiment in which the heat dissipation layers 340 and 350 include a plurality of layers is illustrated, but the present disclosure is not limited thereto, and the heat dissipation layers 340 and 350 may include a single layer.

The heat dissipation layers 340 and 350 may include any suitable material for blocking heat. For example, one heat dissipation layer 340 may include graphite, and the other heat dissipation layer 350 may include copper (Cu). In this case, the graphite may have a plate-shaped structure in which carbon atoms are connected to one another in the horizontal direction. Accordingly, the heat dissipation layer 340 including the graphite may have higher thermal conductivity in the horizontal direction than that in the vertical direction, and may have an excellent heat dissipation effect.

In some embodiments, a shielding layer may be further included. The shielding layer may serve to shield electromagnetic waves generated from the flexible circuit board 400. In addition, the shielding layer may dissipate heat generated from the display part 40 together with the heat dissipation layers 340 and 350. In some embodiments, the heat dissipation layers 340 and 350 may function as a shielding layer.

In FIG. 5A, the embodiment in which the cover panel 300 includes the light blocking layer 310, the cushion layers 320 and 330, and the heat dissipation layers 340 and 350 is illustrated, but the present disclosure is not limited thereto, and at least one of the light blocking layer 310, the cushion layers 320 and 330, and/or the heat dissipation layers 340 and 350 may be omitted as needed or desired.

According to an embodiment, the wires A1 and B1 and the pads P1 and P2 included in the wires A1 and B1 may be disposed on a rear surface of the heat dissipating layer 350. The wires A1 and B1 may be connected to the signal pad portion SL_PAD through the via hole VIA penetrating the cover panel 300. The via hole VIA may penetrate the light blocking layer 310, the cushion layers 320 and 330, and the heat dissipation layers 340 and 350, and may also penetrate the substrate 100.

Hereinafter, a stacked structure of the cover panel 300 according to another embodiment will be described in more detail with reference to FIG. 5B. Redundant description of the same or substantially the same constituent elements as those of FIG. 5A may not be repeated.

The cover panel 300 according to the embodiment of FIG. 5B may include a plurality of functional layers having suitable or desired physical properties (e.g., predetermined physical properties). The functional layers may be referred to as a light blocking layer 310, cushion layers 320 and 330, and heat dissipation layers 340 and 350.

According to an embodiment, the wires A1 and B1 and the pads P1 and P2 included in the wires A1 and B1 may be disposed on a rear surface of the heat dissipating layer 350. The wires A1 and B1 may be connected to a first sub-pad SP_a through a via hole VIA1 penetrating the cover panel 300. In addition, the signal pad portion SL_PAD may be connected to a second sub-pad SP_b through a via hole VIA2 penetrating the substrate 100. The first sub-pad SP_a and the second sub-pad SP_b may be connected to each other. The wires A1 and B1 may be electrically connected through the via holes VIA1 and VIA2, the first sub-pad SP_a, and the second sub-pad SP_b. However, the present disclosure is not limited to the above-described connection method, and one of the first sub-pad SP_a and the second sub-pad SP_b may be omitted.

Figure 6:
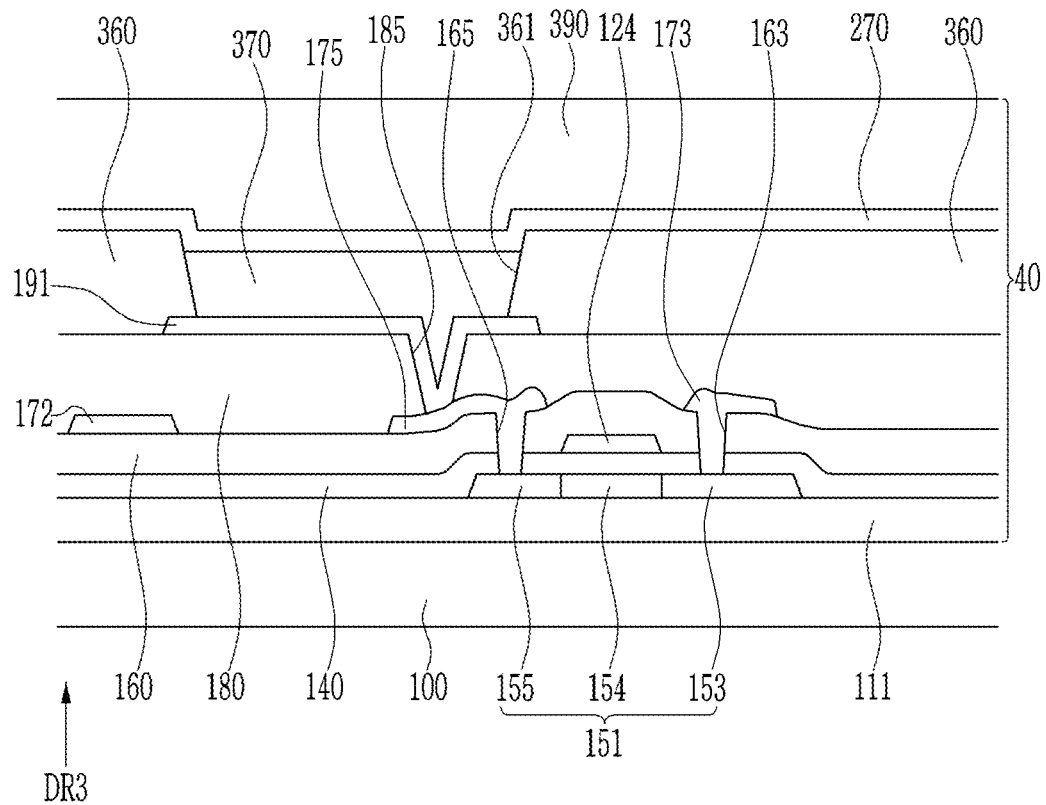
FIG. 6 illustrates a cross-sectional view of a thin film transistor and a light emitting element included in a display part according to an embodiment.

Hereinafter, a thin film transistor and a light emitting element included in the display part 40 will be described in more detail with reference to FIG. 6. FIG. 6 illustrates a cross-sectional view of a thin film transistor and a light emitting element included in the display part according to an embodiment.

The display part 40 according to the present embodiment includes a buffer layer 111 disposed on the substrate 100. The buffer layer 111 may overlap with an entire surface of the substrate 100. The buffer layer 111 may include an inorganic material, for example, such as a silicon oxide (SiOx) or a silicon nitride (SiNx). The buffer layer 111 may be a single layer or multilayers.

The buffer layer 111 may flatten or substantially flatten one surface of the substrate 100, and/or may prevent or substantially prevent diffusion of impurities that may degrade characteristics of a semiconductor layer 151, which will be described in more detail below. The buffer layer 111 may prevent or substantially prevent penetration of moisture and the like. In some embodiments, the buffer layer 111 may be omitted.

The semiconductor layer 151 of the thin film transistor is disposed on the buffer layer 111. The semiconductor layer 151 includes a channel area 154, and a source area 153 and a drain area 155 that are disposed at respective sides of the channel area 154. The source area 153 and the drain area 155 may be doped with impurities.

The semiconductor layer 151 may include a polysilicon, an amorphous silicon, or an oxide semiconductor.

A gate insulating layer 140 is disposed on the semiconductor layer 151. The gate insulating layer 140 may be disposed to overlap with the entire surface of the substrate 100. The gate insulating layer 140 may include an inorganic insulating material, for example, such as a silicon oxide (SiOx) or a silicon nitride (SiNx).

A gate conductor including a gate electrode 124 of the thin film transistor is disposed on the gate insulating layer 140. The gate electrode 124 may overlap with the channel area 154 of the semiconductor layer 151.

A first insulating layer 160 including an inorganic insulating material or an organic insulating material is disposed on the gate electrode 124.

A data conductor including a source electrode 173 and a drain electrode 175 of the thin film transistor, and a driving voltage line 172, is disposed on the first insulating layer 160. The source electrode 173 and the drain electrode 175 may be connected to the source area 153 and the drain area 155, respectively, of the semiconductor layer 151 through contact holes 163 and 165 provided in (e.g., penetrating) the first insulating layer 160 and the gate insulating layer 140. The driving voltage line 172 according to the present embodiment may receive the first power voltage ELVDD.

The gate electrode 124, the source electrode 173, and the drain electrode 175 form the thin film transistor together with the semiconductor layer 151. The illustrated thin film transistor may be a driving transistor included in one pixel of the light emitting display device. The illustrated thin film transistor may be referred to as a top-gate transistor, because the gate electrode 124 is disposed above the semiconductor layer 151. The structure of the transistor is not limited thereto, and may be variously modified. For example, the transistor may be a bottom-gate transistor in which the gate electrode 124 is located under (e.g., underneath) the semiconductor layer 151.

A second insulating layer 180 is disposed on the first insulating layer 160 and the data conductor. The second insulating layer 180 may serve to reduce (e.g., to eliminate) and flatten or substantially flatten a step, to increase light emitting efficiency of a light emitting element to be formed thereon. The second insulating layer 180 may overlap with the thin film transistor, and may cover the thin film transistor.

A pixel electrode 191 is disposed on the second insulating layer 180. The pixel electrode 191 may be connected to the drain electrode 175 of the thin film transistor through a contact hole 185 formed in the second insulating layer 180.

A third insulating layer 360 is disposed on the second insulating layer 180 and the pixel electrode 191. The third insulating layer 360 may overlap with a portion of the pixel electrode 191. The third insulating layer 360 has an opening 361 overlapping with a portion of the pixel electrode 191.

The third insulating layer 360 may include an organic insulating material, for example, such as polyimide, polyacrylate, or polyamide, or an inorganic insulating material.

An emission layer 370 is disposed on the pixel electrode 191. The emission layer 370 includes an emission area. The emission layer 370 may additionally include at least one of a hole injection region, a hole transporting region, an electron injection region, and an electron transporting region.

The emission layer 370 may include an organic material that uniquely emits light of a desired color, for example, such as red, green, and/or blue. In addition, a structure in which a plurality of organic materials for emitting light of different colors from one another are stacked may be provided. However, the present disclosure is not limited thereto, and an inorganic material for emitting a desired color light, for example, such as red, green, and/or blue light, may be included in the emission layer 370.

A common electrode 270 that transmits a common voltage (for example, the second power voltage ELVSS) is disposed on the emission layer 370 and the third insulating layer 360.

The pixel electrode 191, the emission layer 370, and the common electrode 270 of a pixel form a light emitting element, which is a light emitting diode. The pixel electrode 191 may be an anode that is a hole injection electrode, and the common electrode 270 may be a cathode that is an electron injection electrode. As another example, the pixel electrode 191 may be the cathode, and the common electrode 270 may be the anode. Holes and electrons are injected into the emission layer 370 from the pixel electrode 191 and the common electrode 270, respectively, and light is emitted when excitons, in which the injected holes and electrons are combined, enter a ground state from an excited state.

An encapsulation layer 390 may be disposed on the common electrode 270. The encapsulation layer 390 may include a single inorganic layer, a single organic layer, a plurality of inorganic layers, or a plurality of organic layers, or may have a structure in which an inorganic layer and an organic layer are alternately stacked. According to an embodiment, the encapsulation layer 390 may have a structure in which an organic layer is stacked between two inorganic layers.

Hereinafter, a display device according to one or more embodiments will be described with reference to FIG. 7A to FIG. 10. FIG. 7A, FIG. 7B, FIG. 8A, FIG. 8B, FIG. 9A, and FIG. 9B illustrate a top plan view of a display device according to one or more embodiments, and FIG. 10 illustrates a cross-sectional view of a partial area of a display device according to an embodiment. Redundant description of the same or substantially the same constituent elements as those described with reference to one or more of the above embodiments may not be repeated, and the drawings described in more detail above may be cited for convenience.

Figure 7A:
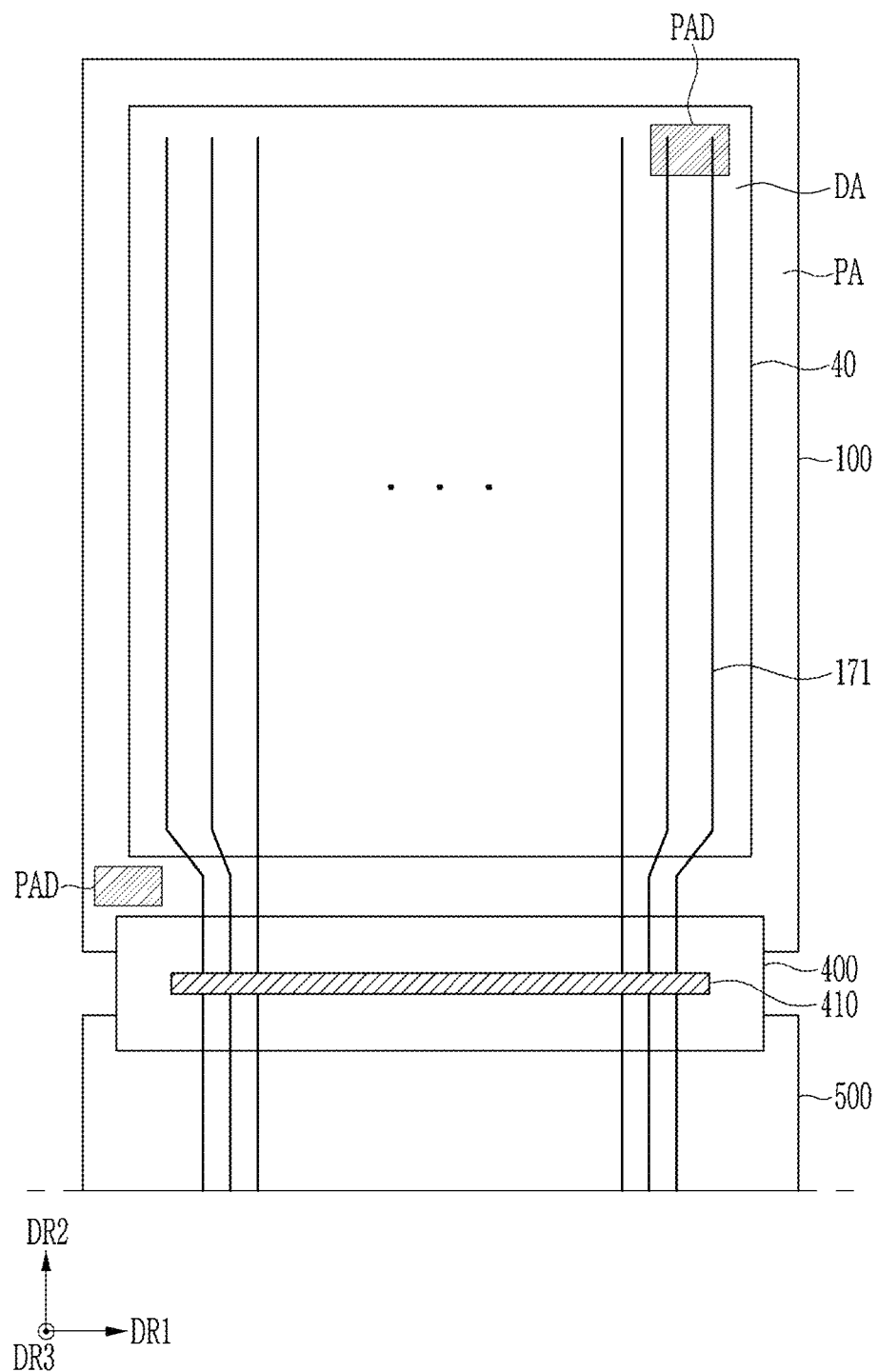
FIGS. 7A-9B illustrate a top plan view of a display device according to one or more embodiments.
Figure 7B:
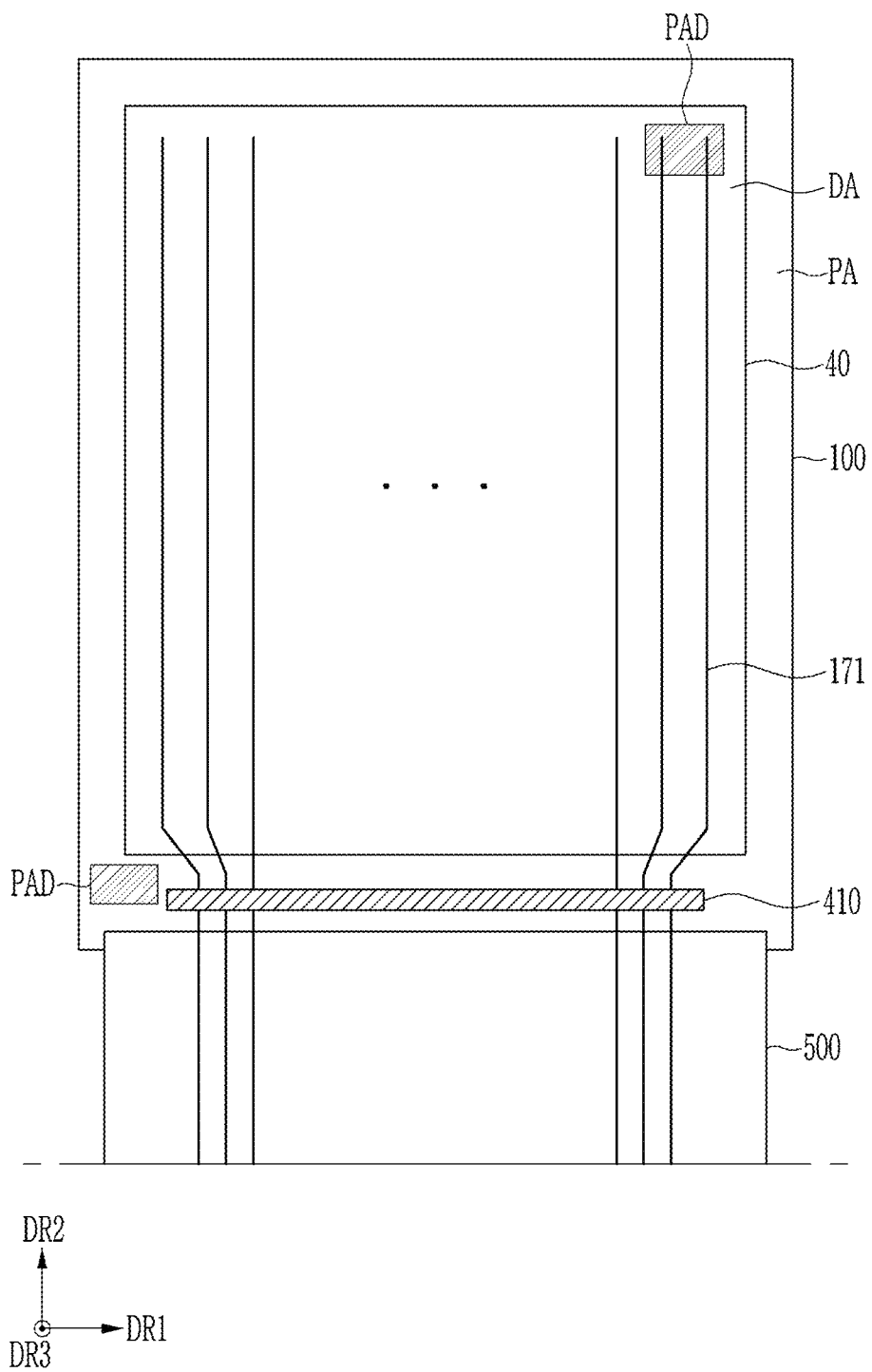

Referring to FIG. 7A and FIG. 7B, in the display device according to one or more embodiments, at least one of a plurality of pad areas PAD may overlap with the display area DA. Each of the plurality of pad areas PAD may be disposed at (e.g., in or on) the display area DA or the peripheral area PA. For example, one pad area PAD may be disposed at (e.g., in or on) the display area DA, and another pad area PAD may be disposed at (e.g., in or on) the peripheral area PA. In the embodiments of FIGS. 7A and 7B, the pad areas PAD are illustrated as being disposed at (e.g., in or on) the display area DA and the peripheral area PA, but the present disclosure is not limited thereto, and the pad areas PAD may be entirely disposed at (e.g., in or on) the display area DA or at (e.g., in or on) the peripheral area PA.

The display device according to one or more embodiments may include the display part 40 that emits light to the front surface of the display device. In more detail, as shown in FIG. 1, the display part 40 may include the plurality of pixels 50, and the plurality of pixels 50 may emit light from the substrate 100 toward a positive third direction +DR3.

In a front emitting display device, the common electrode may be a transparent electrode, and the pixel electrode may be a reflecting electrode. The transparent electrode may include a transparent metal electrode (or a transparent conductive material), for example, such as indium tin oxide (ITO), IZO, $In_2O_3$, or $Sn_2O_3$. The reflecting electrode may include a metal with a small work function, for example, such as a layer in which Ag, Mg, Al, Pt, Pd, Au, Ni, Nd, Ir, Cr, Li, Ca, LiF/Ca, LiF/Al, or a compound thereof is thinly deposited.

Because the display device according to one or more embodiments emits light to the front surface, at least one of the plurality of pad areas PAD may overlap with the display area DA. Even if the pad area PAD overlaps with the display area DA, when the pad area PAD does not overlap with the emission layer, the pad area PAD may not be viewed by a user. When the pad area PAD according to one or more embodiments overlaps with the display area DA, the dead space may be more effectively reduced.

Figure 8A:
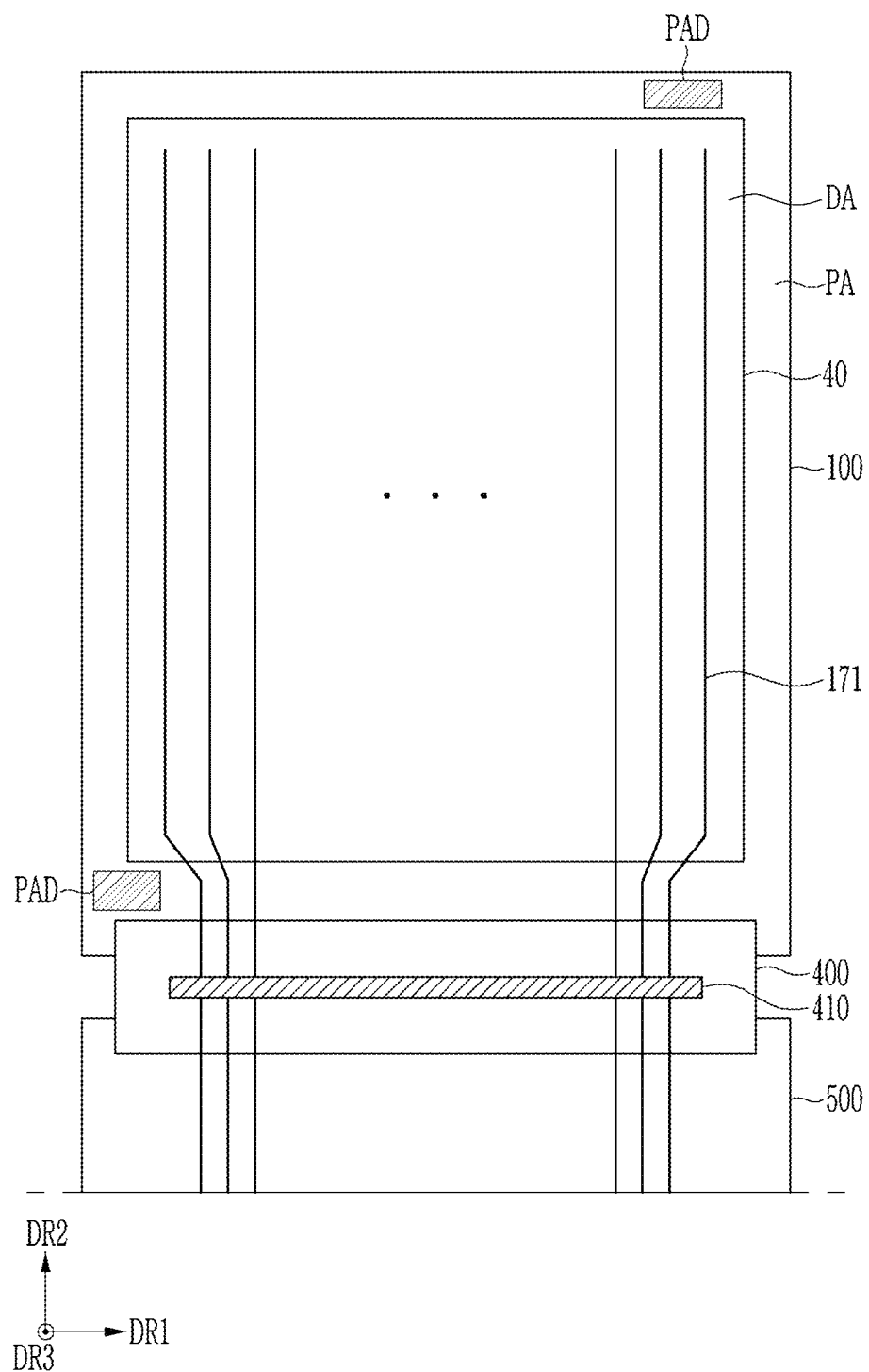
Figure 8B:
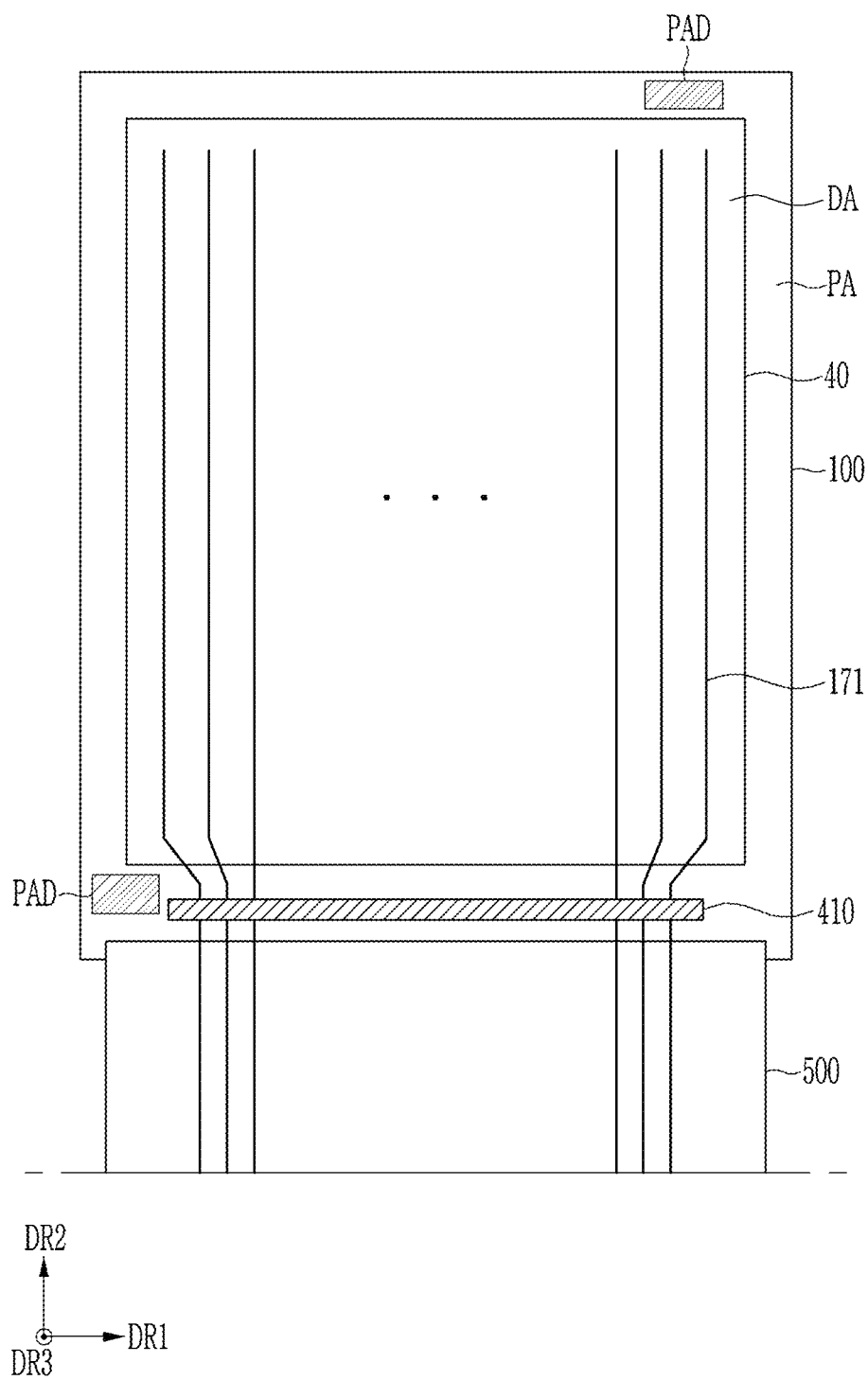

Referring to FIG. 8A and FIG. 8B, in the display device according to one or more embodiments, the plurality of pad areas PAD may overlap with the peripheral area PA.

The display device according to the embodiments of FIGS. 8A and 8B may include the display part 40 that emits light to the rear surface of the substrate 100. As described in FIG. 1, the display part 40 may include a plurality of pixels 50, and the plurality of pixels 50 may emit light in a negative third direction −DR3 with respect to the substrate 100.

When the display part 40 emits light to the rear surface of the substrate 100, the common electrode may be a reflecting electrode, and the pixel electrode may be a transparent electrode. The transparent electrode may include a transparent metal electrode (or a transparent conductive material), for example, such as indium tin oxide (ITO), IZO, $In_2O_3$, or $Sn_2O_3$. The reflecting electrode may include a metal with a small work function, for example, such as a layer in which Ag, Mg, Al, Pt, Pd, Au, Ni, Nd, Ir, Cr, Li, Ca, LiF/Ca, LiF/Al, or a compound thereof is thinly deposited.

Because the display device according to the embodiments of FIGS. 8A and 8B emits light toward the rear surface, the plurality of pad areas PAD may overlap with the peripheral area PA from which light is not emitted. Accordingly, the pad areas PAD may not be viewed by a user.

Figure 9A:
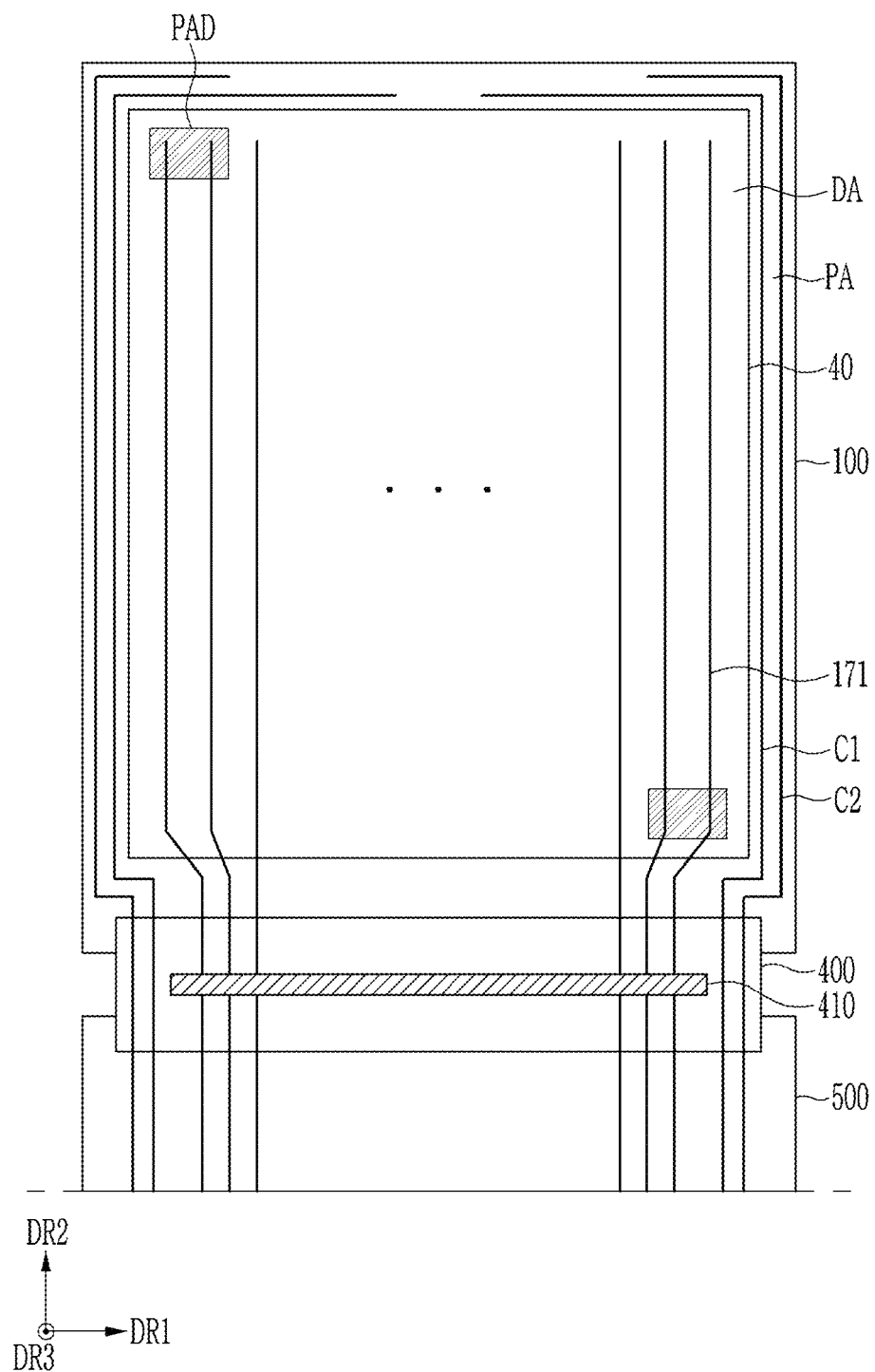
Figure 9B:
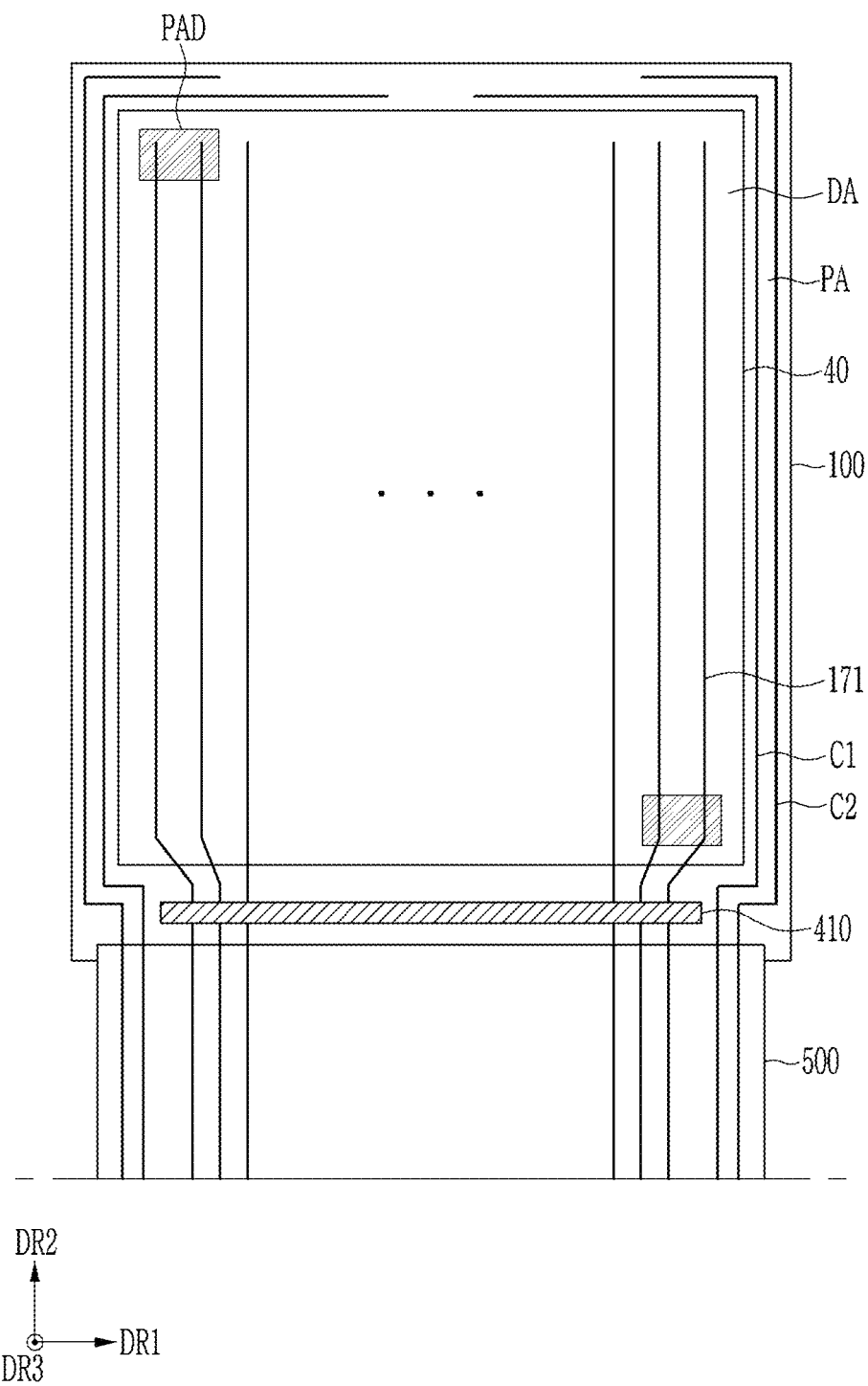
Figure 10:
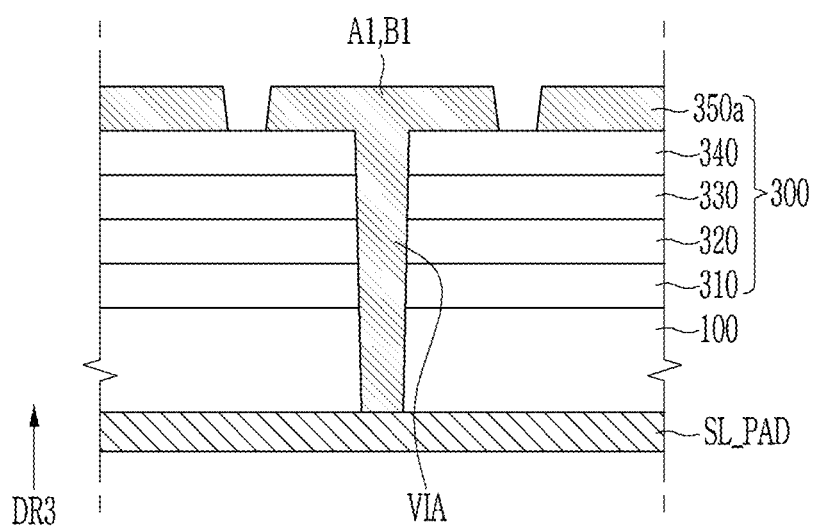
FIG. 10 illustrates a cross-sectional view of a partial area of a display device according to an embodiment.

Referring to FIG. 9A and FIG. 9B, a display device according to one or more embodiments may further include additional power wires C1 and C2 disposed on one surface of the substrate 100. The additional power wires C1 and C2 may overlap with the peripheral area PA of the substrate 100. The additional power wires C1 and C2 may have a shape surrounding (e.g., around at least a portion of a periphery of) the display area DA, but the present disclosure is not limited thereto.

According to the embodiments of FIGS. 9A and 9B, the additional power wires C1 and C2 may be metal wires disposed at (e.g., in or on) the same layer as that of the gate electrode described above with reference to FIG. 6, or metal wires disposed at (e.g., in or on) the same layer as those of the source electrode and the drain electrode described above with reference to FIG. 6, but the present disclosure is not limited thereto.

The display part 40 according to the embodiments of FIGS. 9A and 9B may additionally receive the first power voltage ELVSS and/or the second power voltage ELVDD from the additional power wires C1 and C2 disposed on the one surface of the substrate 100.

As described above, the display part 40 according to one or more embodiments may receive the first power voltage and/or the second power voltage through the pad area PAD from the wire disposed on the rear surface of the substrate 100, for example, on the rear surface of the cover panel. Further, the display part 40 according to the embodiments of FIGS. 9A and 9B may receive the power voltage from the additional power wires C1 and C2. Because a power voltage may be applied through a plurality of areas, a power voltage provided to the plurality of pixels may be uniform or substantially uniform, and reliability of the display device may be improved.

Referring to FIG. 10, the cover panel 300 according to the present embodiment may include the light blocking layer 310, the cushion layers 320 and 330, and heat dissipation layers 340 and 350a.

In some embodiments, an adhesive layer for bonding the respective layers to one another may be further included. The adhesive layer may be a transparent adhesive layer. For example, the adhesive layer may include an optically clear adhesive (OCA), an optically clear resin (OCR), or a pressure sensitive adhesive (PSA).

The light blocking layer 310 is disposed on the rear surface of the substrate 100, and may block light incident on the display part 40. The light blocking layer 310 may include a black tape or a light blocking material.

The cover panel 300 may include the cushion layers 320 and 330 overlapping with the light blocking layer 310. The cushion layers 320 and 330 may absorb a physical impact applied to the display part 40. In some embodiments, the cushion layers 320 and 330 may have a concavo-convex structure, an embossed structure, and/or the like for impact absorption.

In the embodiment of FIG. 10, the cushion layers 320 and 330 are illustrated as including a plurality of layers, but the present disclosure is not limited thereto, and the cushion layers 320 and 330 may include a single layer.

The cushion layers 320 and 330 may include any suitable material capable of absorbing impact. The cushion layers 320 and 330 may include a polymer resin, for example, such as polyurethane, polycarbonate, polypropylene, polyimide, and/or polyethylene, a liquid rubber, a urethane-based material, or a sponge obtained by foam-molding an acrylic-based material.

The cover panel 300 may include the heat dissipation layers 340 and 350a overlapping with the cushion layers 320 and 330. The heat dissipation layers 340 and 350a may dissipate heat generated from the display part 40. In the embodiment of FIG. 10, the heat dissipation layers 340 and 350a are illustrated as including a plurality of layers, but the present disclosure is not limited thereto, and the heat dissipation layers 340 and 350a may include a single layer.

The heat dissipation layers 340 and 350a may include any suitable material for blocking heat. For example, the first heat dissipation layer 340 may include graphite, and the second heat dissipation layer 350a may include copper (Cu).

In this case, the second heat dissipation layer 350a may be disposed at (e.g., in or on) the same layer as those of the wires A1 and B1. The wires A1 and B1, and the second heat dissipation layer 350a spaced apart from the wires A1 and B1, may be disposed on the first heat dissipation layer 340. The second heat dissipation layer 350a may be disposed at (e.g., in or on) areas excluding the areas at (e.g., in or on) which the wires A1 and B1 are disposed. The wires A1 and B1 and the second heat dissipation layer 350a may include the same material as each other, and may be formed through the same process as each other.

Figure 11A:
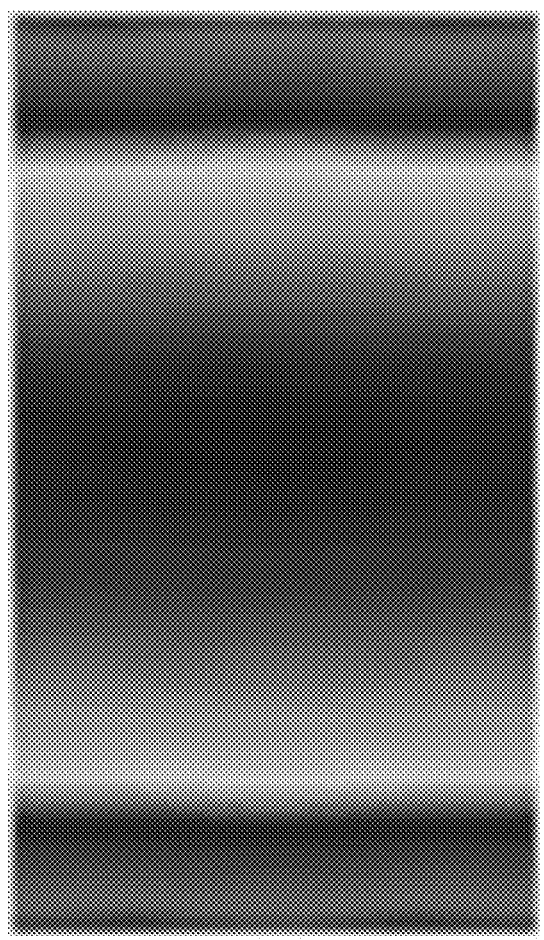
FIG. 11A is a simulation image when an ELVDD power voltage is applied according to an embodiment.
Figure 11B:
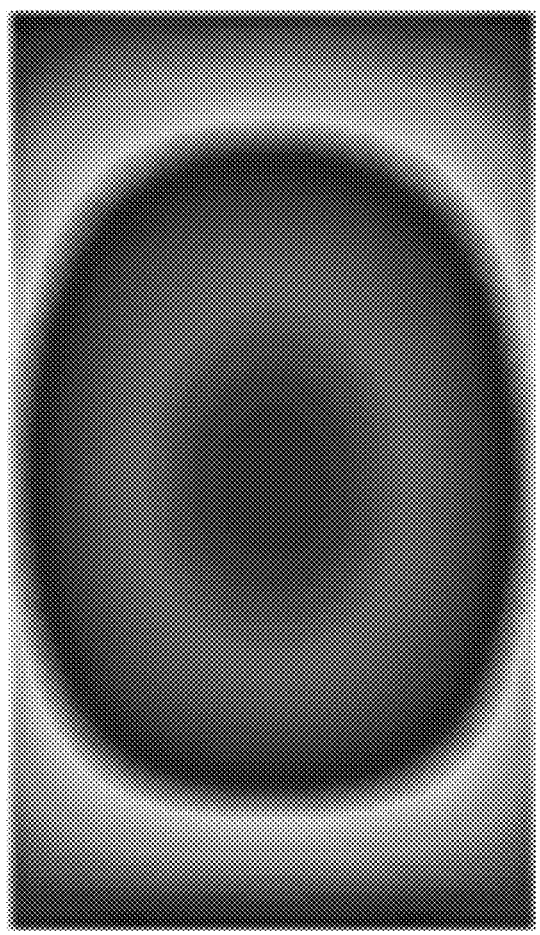
FIG. 11B is a simulation image when an ELVSS power voltage is applied according to an embodiment.
Figure 11C:
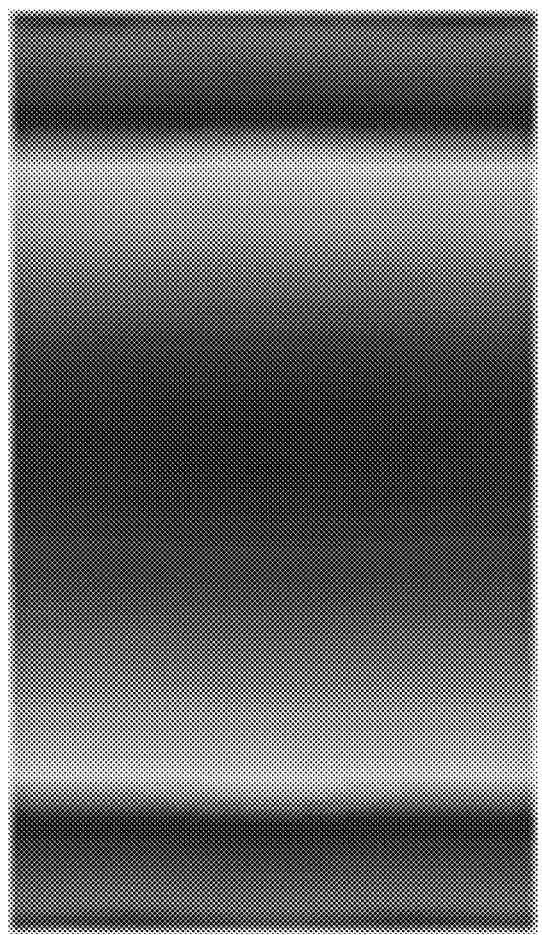
FIG. 11C is a simulation image showing a luminance according to an embodiment.
Figure 12A:
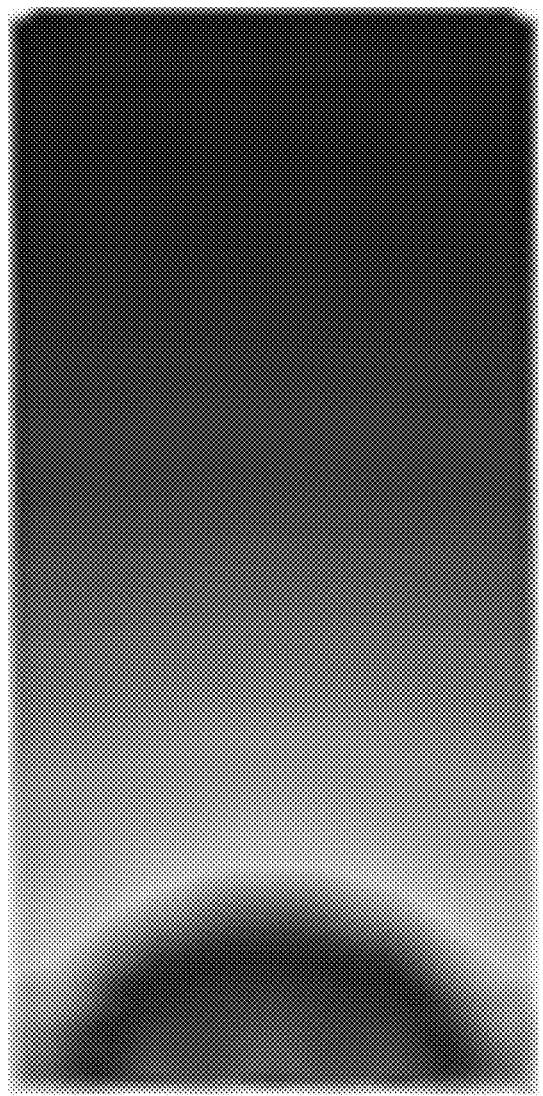
FIG. 12A is a simulation image when an ELVDD power voltage is applied according to a comparative example.

Hereinafter, simulation results of display devices according to an embodiment and a comparative example will be described with reference to FIG. 11A to FIG. 12C. FIG. 11A is a simulation image when an ELVDD power voltage is applied to a display device according to an embodiment, FIG. 11B is a simulation image when an ELVSS power voltage is applied according to an embodiment, and FIG. 11C is a simulation image showing a luminance according to an embodiment. FIG. 12A is a simulation image when an ELVDD power voltage is applied to a display device according to a comparative example that does not include a wire disposed on a cover panel, FIG. 12B is a simulation image when an ELVSS power voltage is applied according to a comparative example, and FIG. 12C is a simulation image showing a luminance according to a comparative example.

First, referring to FIG. 11A and FIG. 11B, it is shown that the ELVDD and ELVSS power voltages are uniformly or substantially uniformly applied, regardless of the position of the display area, because the ELVDD and ELVSS power voltages are applied from both the upper end and the lower end of the display device, and thus, it is shown that the IR drop phenomenon is reduced. As a result, as shown in FIG. 11C, it is shown that the luminance displayed by the display device is also uniformly or substantially uniformly displayed, and a simulation result that is symmetrical along the vertical direction was obtained.

Figure 12B:
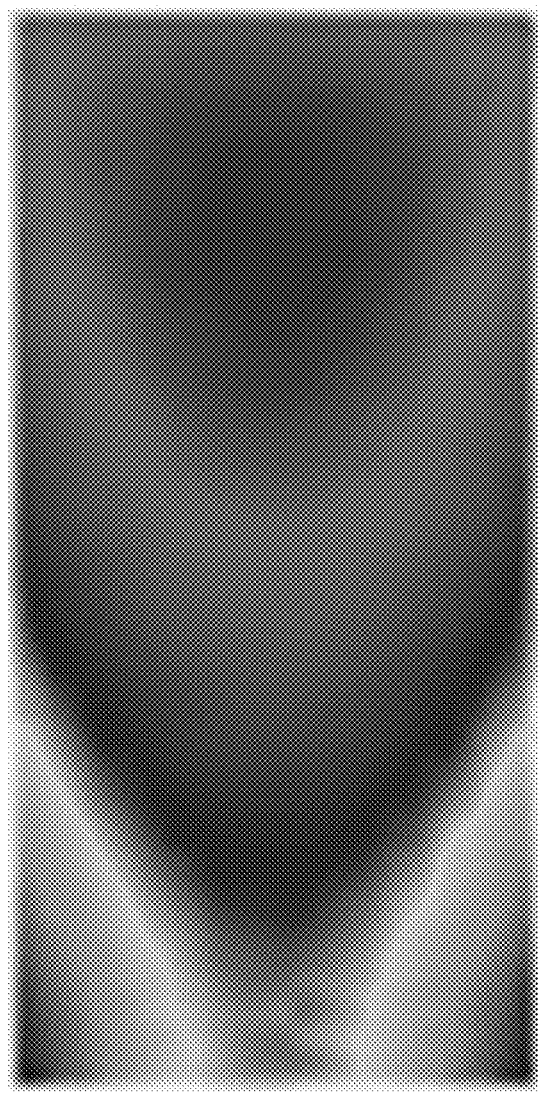
FIG. 12B is a simulation image when an ELVSS power voltage is applied according to a comparative example.
Figure 12C:
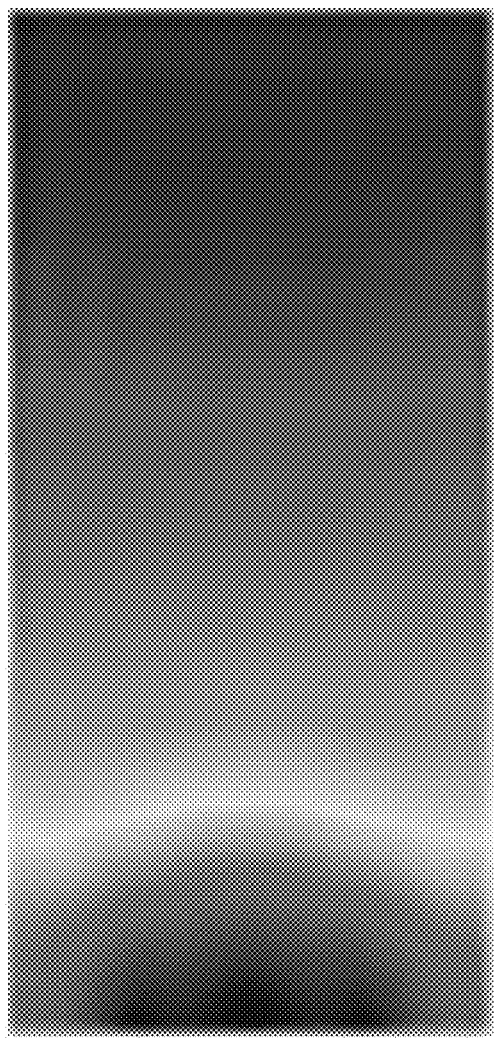
FIG. 12C is a simulation image showing a luminance according to a comparative example.

On the other hand, referring to FIG. 12A and FIG. 12B, it is shown in the display device according to the comparative example that, because the power voltage is applied only from the lower end of the display device, a deviation of the voltage supplied to the upper end and the lower end of the display area occurred due to the IR drop phenomenon. In more detail, it is shown that the IR drop phenomenon occurred along a direction of the long side of the display area from among the long side and the short side of the display area. Accordingly, the luminance displayed by the display device may also be non-uniform as shown in FIG. 12C, and the luminance deviation was largely displayed along the direction of the long side.

The display device according to one or more embodiments may include the power wire disposed on the rear surface of the cover panel. The power wire disposed on the rear surface of the cover panel may be connected to the signal pads that transmit power to the display part at (e.g., in or on) at least two areas, for example, like the upper and lower ends of the flat or substantially flat surface of the substrate. Accordingly, a deviation between the voltages transmitted to the pixels disposed at the upper end of the display area and the pixels disposed at the lower end of the display area may be reduced, so that the IR drop phenomenon may be prevented or substantially prevented, and the luminance generated in the display area may be entirely and uniformly or substantially uniformly provided. The uniformity of display quality may thereby be improved.

In addition, when the power wire is disposed on the rear surface of the cover panel, because the area occupied by the power wire on the substrate may be reduced, the dead space may be reduced. Accordingly, it may be possible to easily implement a full screen display device.

Although some example embodiments have been described, those skilled in the art will readily appreciate that various modifications are possible in the example embodiments without departing from the spirit and scope of the present disclosure. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

DESCRIPTION OF SYMBOLS

310: light blocking layer
320, 330: cushion layer
340, 350: heat dissipation layer
A1, B1: wire
VIA: via hole

The invention claimed is:

1. A display device comprising:
a substrate;
a display part on the substrate, and overlapping with the substrate; and
a cover panel on a rear surface of the substrate, wherein the cover panel comprises:
a functional layer on the rear surface of the substrate;
a via hole penetrating the functional layer; and
a wire on the functional layer, and electrically connected to the display part through the via hole, and
wherein the functional layer comprises at least one of a light blocking layer, a cushion layer, or a heat dissipation layer.

2. The display device of claim 1, wherein the via hole penetrates the substrate.

3. The display device of claim 1, wherein:
the cover panel comprises:
a first surface; and
a second surface overlapping with the first surface, and facing the substrate; and
the wire comprises a pad on the first surface, and overlapping with the via hole.

4. The display device of claim 3, wherein:
the cover panel comprises a pad area at which the via hole and the pad overlap with each other; and
the cover panel comprises a plurality of pad areas.

5. The display device of claim 1, wherein:
the wire is located on a rear surface of the heat dissipation layer.

6. The display device of claim 1, wherein:
the wire and the heat dissipation layer are located at the same layer as each other.

7. The display device of claim 4, wherein the substrate comprises:
a display area configured to display an image; and
a peripheral area around the display area.

8. The display device of claim 7, wherein at least one of the plurality of pad areas overlaps with the display area.

9. The display device of claim 7, wherein the plurality of pad areas overlap with the peripheral area.

10. The display device of claim 7, wherein:
the display device further comprises an additional power wire on the substrate, and overlapping with the peripheral area; and
the additional power wire and the wire are located at different surfaces from each other based on the substrate.

11. The display device of claim 1, wherein the wire comprises:
a first wire configured to supply a first power voltage; and
a second wire configured to supply a second power voltage.

* * * * *

UNITED STATES PATENT AND TRADEMARK OFFICE
CERTIFICATE OF CORRECTION

PATENT NO. : 12,075,646 B2  
APPLICATION NO. : 17/298897  
DATED : August 27, 2024  
INVENTOR(S) : Hyeong Gwaon Kim et al.

Page 1 of 1

It is certified that error appears in the above-identified patent and that said Letters Patent is hereby corrected as shown below:

On the Title Page

Item (54), in Column 1, under "Title", Line 2, delete "CONNTECTED" and insert -- CONNECTED --.

In the Specification

In Column 1, Line 2, delete "CONNTECTED" and insert -- CONNECTED --.

Signed and Sealed this  
Second Day of September, 2025

Coke Morgan Stewart  
*Acting Director of the United States Patent and Trademark Office*